United States Patent [19]
Lampman et al.

[11] Patent Number: 5,532,595
[45] Date of Patent: Jul. 2, 1996

[54] THREE-DIMENSIONAL SPIRAL ECHO VOLUME IMAGING

[75] Inventors: David A. Lampman, Eastlake; Haiying Liu, Euclid, both of Ohio

[73] Assignee: Picker International, Inc., Highland Heights, Ohio

[21] Appl. No.: 228,661

[22] Filed: Apr. 18, 1994

[51] Int. Cl.$^6$ .................................................. G01R 33/44
[52] U.S. Cl. ........................................... 324/309; 324/307
[58] Field of Search .................................. 324/300, 306, 324/307, 309, 312, 314; 128/653.2, 653.3

[56] References Cited

U.S. PATENT DOCUMENTS

| | | | |
|---|---|---|---|
| 4,985,677 | 1/1991 | Pauly | 324/309 |
| 5,025,216 | 6/1991 | Pauly | 324/309 |
| 5,057,776 | 10/1991 | Macovski | 324/309 |
| 5,105,152 | 4/1992 | Pauly | 324/309 |
| 5,122,747 | 6/1992 | Riederer | 324/312 |
| 5,122,748 | 6/1992 | Oh et al. | 324/309 |
| 5,258,711 | 11/1993 | Hardy | 324/309 |
| 5,270,653 | 12/1993 | Pauly | 324/309 |
| 5,304,931 | 4/1994 | Flamig et al. | 324/309 |
| 5,349,294 | 9/1994 | Kusuboski | 324/309 |

FOREIGN PATENT DOCUMENTS

| | | |
|---|---|---|
| 0412819 | 2/1991 | European Pat. Off. . |
| 2208718 | of 0000 | United Kingdom . |
| WO92/02829 | of 0000 | WIPO . |
| WO92/12439 | 7/1992 | WIPO . |

OTHER PUBLICATIONS

"A Three–Dimensional Spin–Echo or Inversion Pulse", Pauly, et al., Magnetic Resonance in Medicine, 29 (1993) Jan., No. 1, pp. 2–6.

"A Fast Spectroscopic Imaging Method Using a Blipped Phase Encode Gradient", Webb, et al., Magnetic Resonance in Medicine, 12 (1989), Dec., No. 3, pp. 306–315.

"Application of Single–Shot Spiral Scanning for Volume Localization", Ra, et al., Magnetic Resonance in Medicine, 17 (1991) Feb., No. 2, pp. 423–433.

"Volumetric NMR Imaging with Time–Varying Gradients", Macovski, Magnetic Resonance in Medicine, 2 (1985) Feb., No. 1, pp. 29–40.

"High–Speed Spiral–Scan Echo Planar NMR Imaging—I", Ahn, et al. IEEE Trans. on Med. Imaging, vol. MI–5, No. 1, Mar. 1986.

(List continued on next page.)

*Primary Examiner*—Sandra L. O'Shea
*Assistant Examiner*—Raymond Y. Mah
*Attorney, Agent, or Firm*—Fay, Sharpe, Beall, Fagan, Minnich & McKee

[57] ABSTRACT

Magnetic resonance imaging data of a volume of interest is collected by applying a radio frequency pulse (70, 96) and following the pulse with gradients applied along three axes (x,y,z). The gradients along x and y-axes are generally sinusoidal, which sinusoids increase and decrease in magnitude to define beat patterns of a common period. The period of the first and second gradients is an integer multiple of the gradient along the z-axis. In the embodiment of FIGS. 2A and 2B, the beats of the first and second gradients increase linearly and the third gradient oscillates in a linearly expanding generally sinusoidal pattern such that k-space is traversed by a trajectory that spirals around a series of spheres (50, 52, 54, 56, 58, 60) of progressively smaller radius. Blips or spikes (78) are preferably applied between each half cycle of the third gradient to step the trajectory to the radius of the next concentric sphere. In the embodiment of FIGS. 3A and 3B, the magnitude of the beats of the first and second gradients remain substantially constant and the gradient pulses along the third axis are applied generally between and at the mid-point of each beat such that the trajectory through k-space follows a series of parallel spirals lying along a cylinder. In the embodiment of FIGS. 4–4D, the beat patterns again increase linearly and the third gradient alternates polarity with each half beat such that the trajectory through k-space spirals around a series of concentric cones.

19 Claims, 12 Drawing Sheets

OTHER PUBLICATIONS

"Volume–Selective Excitation: A Novel Approach to Topical NMR", Aue, et al. J. Mag. Reson. vol. 56, pp. 350–354 (1984).

"A k–Space Analysis of Small–Tip–Angle Excitation", Pauly, et al., J. Mag. Reson. vol. 81, pp. 43–56 (1989).

"Correcting for Nonuniform k–Space Sampling in Two–Dimensional NMR Selective Excitation", Hardy, et al., J. Mag. Reson. vol. 87, pp. 639–645 (1990).

"New Spatial Localization Method Using Pulsed High–Order Field Gradients (SHOT: Selection with High–Order gradienT)," Oh, et al., Magn. Reson. in Medicine, vol. 18, pp. 63–70 (1991).

"A Three–Dimensional $\pi$ Pulse", Pauly, et al., SMRM Book of Abstracts, vol. 2, p. 493 (1991).

"Region of Interest Selection by Outer Volume Saturation", Crespigny, et al. (1989).

THREE-DIMENSIONAL SPIRAL ECHO VOLUME IMAGING

BACKGROUND OF THE INVENTION

The present application relates to the magnetic resonance imaging arts. It finds particular application in conjunction with a well-known rapid imaging technique known as echo planar imaging (EPI) and echo volume imaging (EVI) and will be described with particular reference thereto.

As described by Peter Mansfield in "Multi-Planar Image Formation Using NMR Spin Echoes", J. Phys. C., Vol. 10, pp 150–158 (1977) echo planar imaging rapidly induces a series of echoes following a single RF pulse. More specifically, an RF pulse and a slice select gradient are applied to excite resonance in a selected slice and a phase encode gradient is applied to phase encode the resonance. A series of read gradients of alternating polarity are applied immediately following each other. During each read gradient, a magnetic resonance signal or echo is read out. Between each read gradient, a short pulse or blip along the phase encode gradient axis is applied to increment the phase encoding of the resonance in the selected slice. A one-dimensional inverse Fourier transform of each echo provides a projection of the spin distribution along the read axis. A second inverse Fourier transform along the phase encoded echoes provides a second dimension of spatial encoding. Typically, the phase encode gradient blips are selected of an appropriate magnitude that data for a complete field of view is taken following each RF pulse. The total sampling time is determined by the number of sampled points per read gradient and the number of phase encode gradient steps.

As set forth in published U.K. Patent Application No. 2,208,718, Peter Mansfield has extended the above-described rectilinear echo planar imaging techniques to multiple planes. After performing the above-described echo planar imaging sequence, a pulse or blip along the slice select axis is applied. The slice select blip steps the phase encoding along a slice select axis, e.g. a z-axis. Thereafter, phase encode gradient blips are applied between each read gradient to step along the second plane in the phase encode direction. Because the phase encode blips in the first plane move the phase encoding to one extreme edge of the field of view, the phase encoding blips in the second slice are of the opposite polarity to step the phase encoding back in the opposite direction. In this manner, the multiple planes are aligned, but offset in steps in the z-direction.

Although the rectilinear echo planar imaging and the rectilinear echo volume imaging techniques of Mansfield have been proven successful, they have a significant drawback. In particular, each of the phase encode gradient blips and each of the slice select gradient blips induces eddy currents. The eddy currents cause ghosting and other artifacts commonly attributed to eddy currents in the resultant images. Another disadvantage of the rectilinear echo volume imaging is that the trajectory through k-space is reversed in time for alternate phase encode lines or "views". This causes phase discontinuities which can result in ghosting. Another problem with both the rectilinear echo planar and volume imaging resides in the gradient duty cycle. In general, most of the gradient duty cycle is concentrated on the read axis, with only small blips on the other axes. This dumps most of the gradient duty cycle load on a single set of amplifiers.

In spiral echo planar imaging techniques described in U.S. Pat. No. 4,307,303 issued December 1991 to Likes, and in the article "High-Speed Spiral-Scan Echo Planar NMR Imaging I", IEEE Trans. on Med. Imaging, Vol. MI-5, No. 1, pp 1–7 (March 1986) of Ahn, et al., these problems are mitigated. In particular, in the spiral echo planar imaging technique, the applied x and y-gradient pulses, i.e. along the traditional read and phase encode axes, are sinusoidally varying and linearly increasing. In this manner, data sampling commences at the center of the field of view and spirals outward, covering the field of view along a spiral trajectory. The spiral trajectory has several advantages including that it has a circularly symmetric point spread function as opposed to the non-isotropic point spread function of rectilinear echo planar imaging. Any artifacts in the spiral echo planar imaging from gradient eddy currents or a field inhomogeneity cause a rotational misregistration of the object; whereas, in rectilinear echo planar imaging, the time reversal of alternate views introduces a discontinuous phase error that results in ghost images. The spiral echo planar imaging also has a T2 weighting that is uniform in all directions; whereas, in rectilinear echo planar imaging, the T2 weighting is different in the x and y-directions.

Further, in spiral echo planar imaging, the gradient duty cycle is reduced relative to the gradient duty cycle required in rectilinear echo planar imaging. In spiral echo planar imaging, the gradients are linearly increasing on both axes. In rectilinear echo planar imaging, the gradient at full amplitude switches polarity or oscillates while the gradient along the other axis is only small blips. Further, in spiral echo planar imaging, the k-space trajectory varies more slowly and smoothly than in rectilinear echo planar imaging. The blips can again induce unwanted errors due to non-ideal gradients. Eddy currents or delays in the blipped gradient pulse introduce unwanted errors in the k-space trajectory in the region of the blips.

One of the drawbacks of the spiral echo planar imaging is that it is a single slice technique. To obtain multiple slices, the spiral echo planar imaging technique is repeated multiple times. An RF excitation pulse and slice select gradient followed by sinusoidally varying and linearly increasing x and y-gradients are applied for each slice.

The present invention contemplates a new and improved volume imaging technique in which k-space is sampled along curved paths such as spirals or circles.

SUMMARY OF THE INVENTION

In accordance with the present invention, a three-dimensional magnetic resonance imaging technique is provided. The imaged volume is sampled along curving trajectories through k-space.

In accordance with one more specific embodiment of the invention, the volume is sampled along surfaces of spheres or ellipsoids with progressively smaller (or larger) radii.

In accordance with another aspect of the present invention, the volumetric region is sampled along concentric cones with different degrees of convergence.

In accordance with another aspect of the present invention, the volume of interest is sampled along spirals or concentric circles that lay along a series of parallel planes.

In accordance with another aspect of the present invention, generally sinusoidal gradients are applied along at least two of the three axes of the volume of interest.

In accordance with another more limited aspect of the present invention, the sinusoidal gradient along at least some of the axes increases and decreases in amplitude analogous to a beat pattern.

In accordance with a yet more limited aspect of the present invention, the amplitude of the beats in the beat-type pattern of the sinusoidally varying gradient increase or decrease generally linearly.

One advantage of the present technique is that all three dimensions are spatially encoded in a single shot. The overhead of acquiring multiple views or acquiring multiple slices with each slice acquisition delayed by the TE time and slice excitation delays is avoided.

Another advantage of the present invention is that the trajectories through k-space have fewer discontinuities and phase reversals. Image artifacts due to such discontinuities are substantially reduced.

Another advantage of the present technique is that the shape of the imaged volume can be adjusted in accordance with the shape of the volume of interest. Sampling is more efficient and optimal because a full cube or rectangular volume of data need not be collected. Data collection can be limited to a sphere, cylinder, ellipsoid, or other such shape.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
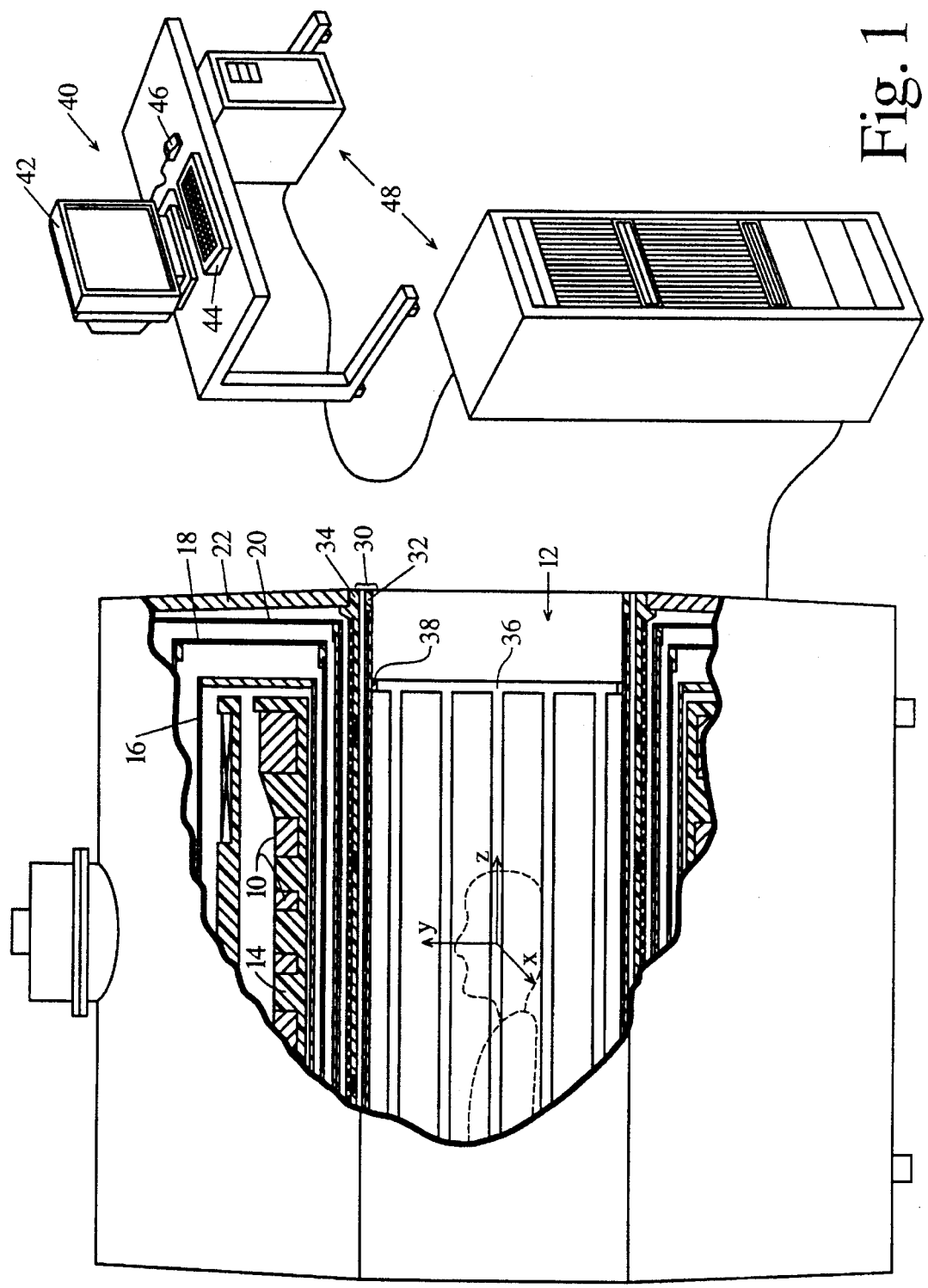
FIG. 1 is a diagrammatic illustration of a magnetic resonance scanner in accordance with the present invention.

With reference to FIG. 1, a plurality of primary magnet coils 10 generate a temporally constant magnetic field along a longitudinal or z-axis of a central bore 12. In a preferred superconducting embodiment, the primary magnet coils are supported by a former 14 and received in a toroidal helium vessel or can 16. The vessel is filled with liquid helium to maintain the primary magnet coils at superconducting temperatures. The can is surrounded by a series of cold shields 18, 20 which are supported in a vacuum dewar 22.

A whole body gradient coil assembly 30 includes x, y, and z-coils mounted along the bore 12. Preferably, the gradient coil assembly is a self-shielded gradient coil assembly that includes primary x, y, and z-coil assemblies potted in a dielectric former 32 and a secondary gradient coil assembly 34 that is supported on a bore defining cylinder of the vacuum dewar 22. A whole body RF coil 36 is mounted inside the gradient coil assembly 30. A whole body RF shield 38, e.g. copper mesh, is mounted between RF coil 36 and the gradient coil assembly 34.

An operator interface and control station 40 includes a human-readable display such as a video monitor 42 and an operator input means including a keyboard 44 and a mouse 46. A computer control and reconstruction processor module 48 includes computer hardware and software for controlling the radio frequency coil 36 and the gradient coil 30 to implement any of a multiplicity of conventional magnetic resonance imaging sequences, including echo planar and echo volume imaging sequences. The processor module 48 also includes a digital transmitter for providing RF excitation and resonance manipulation signals to the RF coil and a digital receiver for receiving and demodulating magnetic resonance signals. An array processor and associated software reconstruct the received magnetic resonance signals into an image representation which is stored in computer memory or on disk. A video processor selectively extracts portions of the stored reconstructed image representation and formats the data for display by the video monitor 42.

Figure 2A:
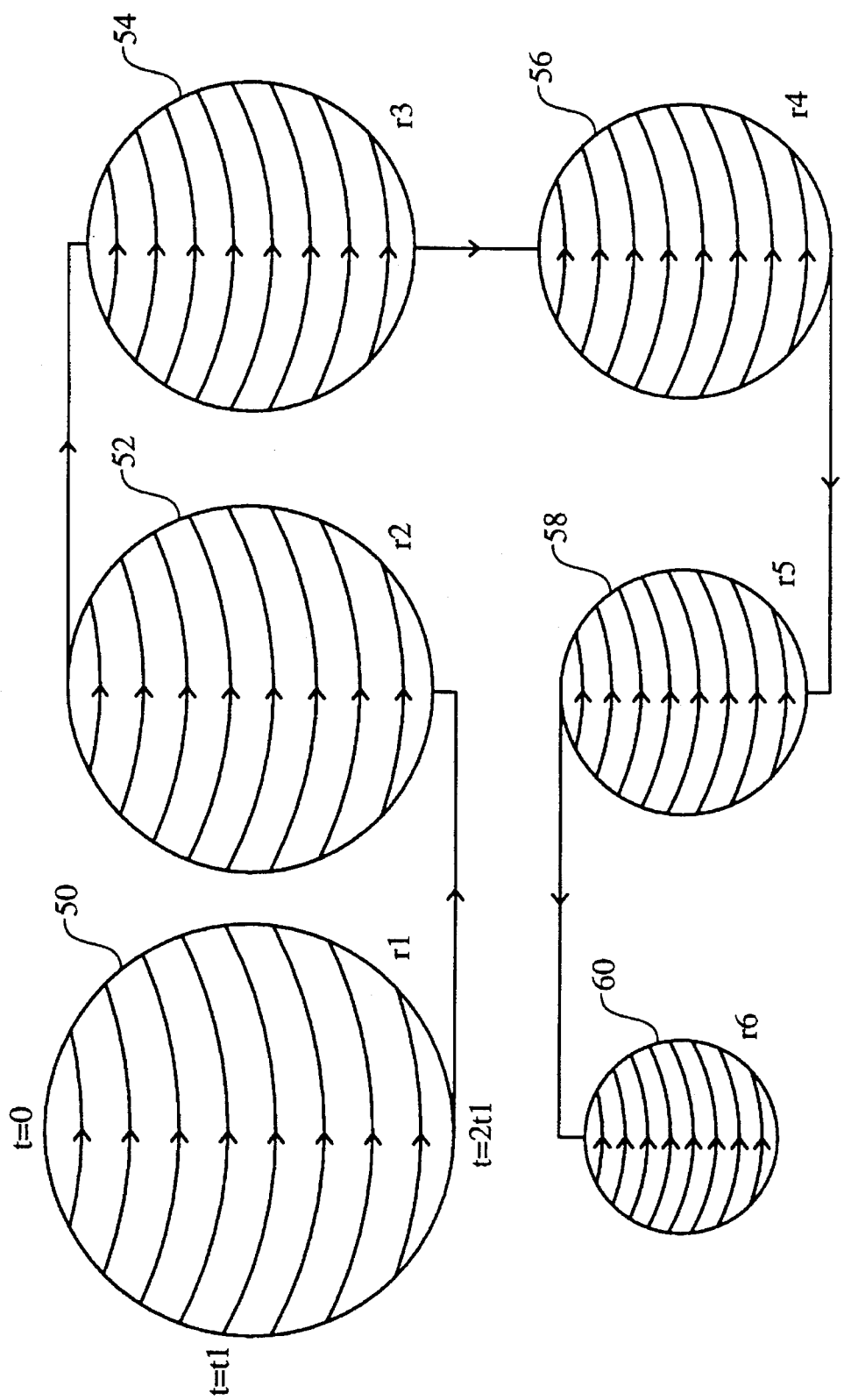
FIG. 2A is a diagrammatic illustration of a spherical spiral k-space trajectory.

With reference to FIG. 2A, the processor 48 controls an RF transmitter, preferably a digital RF transmitter, and x, y, and z-gradient coil drivers and amplifiers in such a manner that the sampling trajectory through k-space spirals around the surface of a spheroid 50. Although a sphere is illustrated, other shapes such as ellipsoids are also contemplated. After the first spheroidal surface is covered, the trajectory is indexed and the surface of a second spheroidal surface 52 is covered. Analogously, the trajectory is periodically indexed to cover spheroids 54, 56, 58, 60, etc. In this way, a set of spheroids inside one another is collected in k-space. Ideally, these spheres or ellipsoids would be concentric, but there are some advantages to acquiring non-concentric spheres or ellipsoids and then realigning them with a post-acquisition phase correction in order to restore concentricity. The number of spheres/ellipsoids determines the resolution in one dimension, with the resolution in the other two dimensions given by the number of points sampled on the surface of each sphere. This coverage can be either isotropic or anisotropic. In either case, there are three different methods for covering k-space: (1) concentric spheres or ellipsoids having different radii. (2) The spheres or ellipsoids are not concentric and successive spheres/ellipsoids are of different radii and are joined at the poles. The radius of each sphere or ellipsoid is kept constant during the trajectory over the surface of that sphere. When the trajectory reaches the opposite pole, the radius is increased (or decreased) in order to traverse the next sphere of the larger (or smaller) radius. (3) The ellipsoids are not concentric and the radius is a function of time such that in traversing the ellipsoid from one pole to the next, one ends up at the beginning radius of the next ellipsoid to be acquired. Each of these three cases is explained separately below.

When the spheroids or ellipsoids are acquired in a concentric fashion, there is a discontinuous jump to the radius of the next sphere. For the more general anisotropic case, the trajectory through k-space is given by:

$$k_x(t) = \sum_{n=1}^{N} \gamma r_{x,n} \sin(w_1 t)\cos(w_2 t)\theta(t - 2(n-1)t_1), \quad (1a)$$

$$k_y(t) = \sum_{n=1}^{N} \gamma r_{y,n} \sin(w_1 t)\sin(w_2 t)\theta(t - 2(n-1)t_1), \quad (1b)$$

$$k_z(t) = \sum_{n=1}^{N} \gamma r_{z,n} \cos(w_1 t)\theta(t - 2(n-1)t_1). \quad (1c)$$

In these equations, $r_n$ is the radius of the n-th sphere, $\theta$ is the usual Heaviside step function, and N is the number of spheres. The boundary conditions are:

$$@ \; t = 0; \quad k_z = r_{z,n} \quad (2a)$$
$$k_x = k_y = 0,$$

$$@ \; t = t_1; \quad k_z = k_y = 0 \quad (2b)$$
$$k_x = r_{x,n},$$

$$@ \; t = 2t_1; \quad k_z = -r_{z,n} \quad (2c)$$
$$k_x = k_y = 0.$$

The time $2t_1$ is the time it takes to cover the surface of the n-th sphere. These boundary conditions give the following relationships for $w_1$ and $w_2$:

$$w_2 = 2mw_1; \quad m = \text{number of spirals/sphere}, \quad (3a)$$

$$w_1 = \frac{\pi}{2t_1}. \quad (3b)$$

Figure 2B:
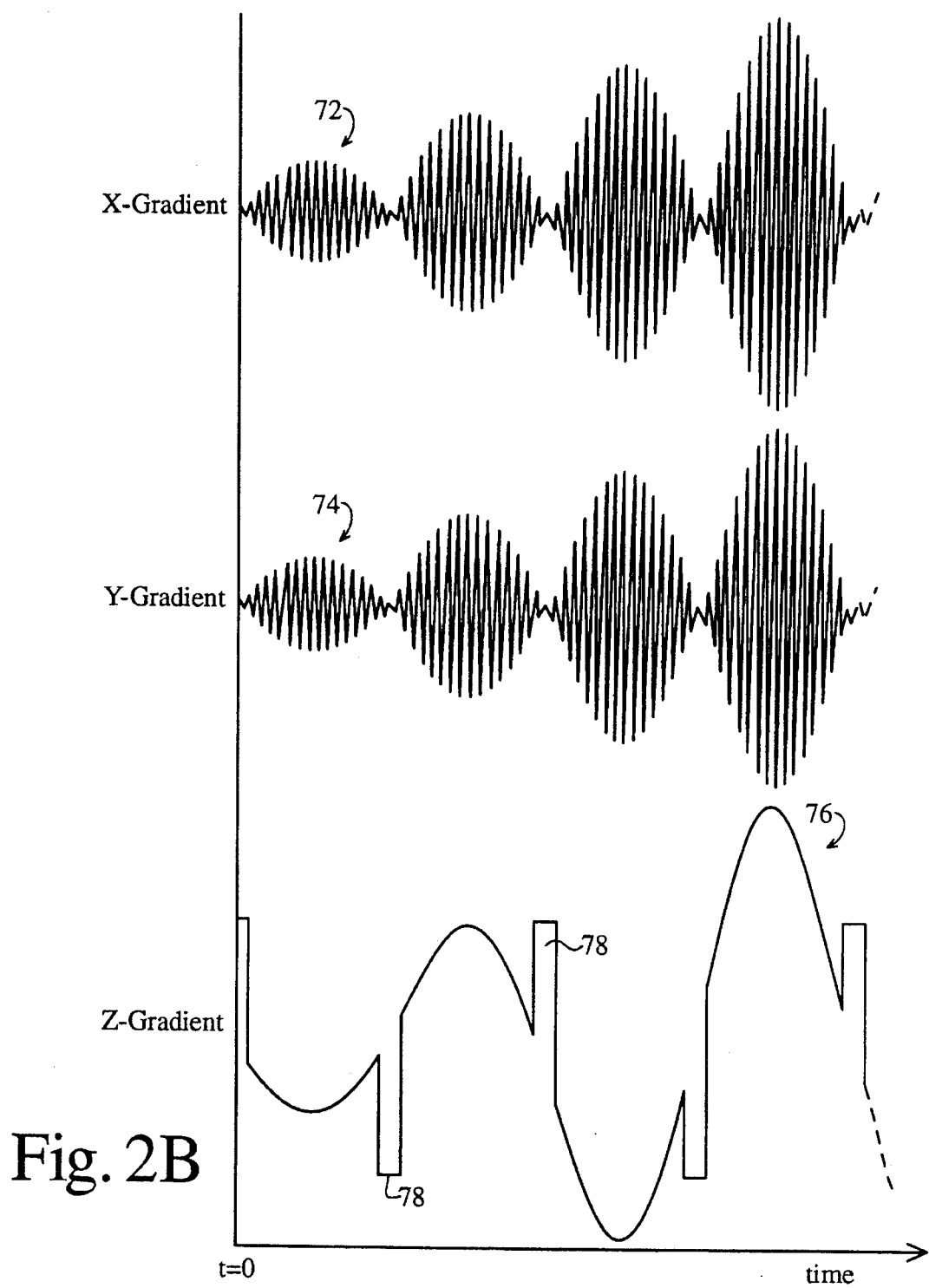
FIG. 2B is a timing chart illustrating the gradient pulse sequence for achieving a trajectory along concentric spheres.

FIG. 2B illustrates the gradient sequence which is actually applied. The FIGURE shows only the gradient pulses applied during the sampling of the signal, and does not include the preparatory RF and/or gradient pulses used to excite or otherwise manipulate the magnetization. Sinusoidal x and y-gradients 72, 74 which expand and contract in a beat pattern are applied by the x and y-gradient coils. A z-gradient 76 is more slowly varying. More specifically, each half-cycle of the z-gradient has substantially the same duration as one beat of the x and y-gradients. Within the half-cycle of the z-gradient and the one beat of the x and y-gradient, the trajectory around one sphere is traversed. After each sphere is covered, the z-gradient is pulsed 78 to step the trajectory to the radius of the next sphere. The next half-cycle of the z-gradient steps the radius of the sphere to the second radius, and so forth for successive half cycles of the z-gradient.

The gradient profiles which provide this coverage of k-space are defined by:

$$G_i(t) = \frac{1}{\gamma} \frac{d}{dt} [k_i(t)], \quad (4)$$

where i=x, y, or z. More specifically, the x, y, and z-gradients in the preferred embodiment are:

$$G_x(t) = \quad (5a)$$

$$\sum_{n=1}^{N} \theta\left(t - 2(n-1)t_1\right) \left[ \frac{r_{x,n}w_1}{2} [1 - 2m]\cos[(1 - 2m)(w_1 t)] + \frac{r_{x,n}w_1}{2} [1 + 2m]\cos[(1 + 2m)(w_1 t)] \right],$$

$$G_y(t) = \quad (5b)$$

$$\sum_{n=1}^{N} \theta\left(t - 2(n-1)t_1\right) \left[ \frac{r_{y,n}w_1}{2} [1 + 2m]\sin[(w_1 t)(1 + 2m)] - \frac{r_{y,n}w_1}{2} [1 - 2m]\sin[(w_1 t)(1 - 2m)] \right],$$

$$G_z(t) = \sum_{n=1}^{N} -r_{z,n}w_1[\sin(w_1 t)]\theta(t - 2(n-1)t_1) + \quad (5c)$$

$$\sum_{n=1}^{N} r_{z,n}\cos(w_1 t)\delta(t - 2(n-1)t_1$$

The terms with delta functions in the x and y-gradients drop out because their coefficients are zero at $t=2(n-1)t_1$. For isotropic coverage in k-space, m=N and $r_x = r_y = r_z$. For uniform sampling, either isotropic or anisotropic, $r_{i,n}=r_i$, where i=x, y, or z. If $r_x \neq r_y \neq r_z$, ellipsoidal sampling is provided.

Note that in the present situation, the radius is not changed except when the "view" i.e. the sphere, is changed from n to n+1. In this manner, although there are discontinuities in the gradient waveform, they can be kept small if enough spheres or spheres of sufficiently close radius are sampled.

In order to avoid the delta functions on the z-gradient, the spheres can be allowed to touch one another at the poles, alternating between making contact at the north and south poles. In this way, there is no discontinuous jump along $k_z$. The spheres are no longer concentric since their centers shift back and forth along the $k_z$ axis. The radius of each spheroid is kept constant during the trajectory over the surface of that spheroid. For reconstructing the data into an image, an interpolation between the spheres is done to regrid the data. This eliminates the phase errors caused by collecting non-concentric spheres. This process is described in more detail in the section on reconstruction below.

Figure 2C:
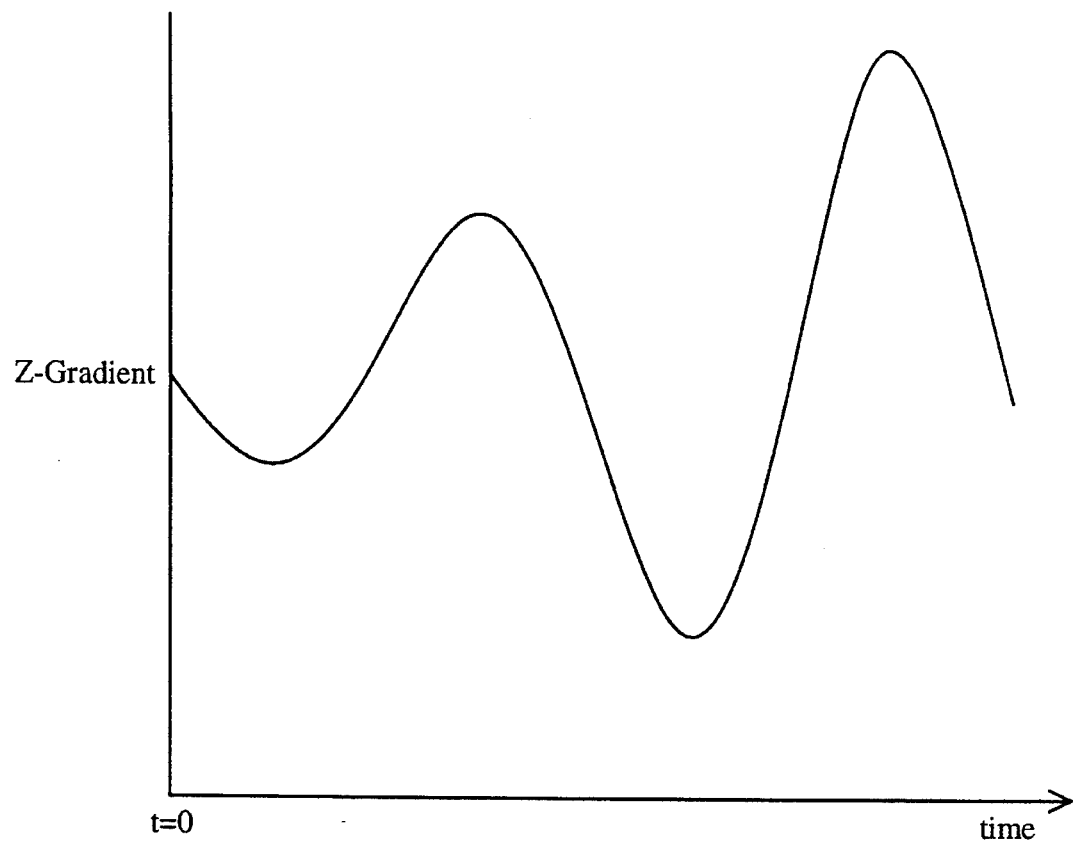
FIG. 2C is an alternate embodiment of the z-gradient of FIG. 2B for achieving a trajectory along non-concentric spheres which touch a next larger spheroid at one pole and a next smaller spheroid at the other pole.

In this case, the $k_x$ and $k_y$ trajectories are the same as before. The x and y-gradients are therefore the same as FIG. 2B. The z-gradient spikes 78 for stepping to the next radius are eliminated. With reference to FIG. 2C, the $k_z$ trajectory is modified such that the radii of the spheroids change when the view n increments, but there is no translation along $k_z$. This is accomplished by adding an extra term in the previous expression for $k_z$ that cancels out the translation along $k_z$. Once again, preparatory pulses are not shown in FIG. 2C, including an initial dephasing z-gradient pulse that provides an offset along $k_z$ to the starting point on the first sphere.

The expressions for $k_z(t)$ and $G_z(t)$ are then:

$$k_z(t) = \sum_{n=1}^{N} \gamma r_z \theta(t - 2(n-1)t_1)\cos(w_1 t) + \quad (6a)$$

$$\gamma r_z \left[ 1 + \sum_{n=1}^{N} (-1)^n \theta(t - 2(n-1)t_1 \right]$$

$$G_z(t) = \sum_{n=1}^{N} -r_z w_1[\sin(w_1 t)]\theta(t - 2(n-1)t_1) \quad (6b)$$

In these equations, uniform sampling is assumed for computational simplicity. The advantage of this trajectory is that there are no discontinuities in the k-space trajectory between spheroids which would introduce discontinuities in the gradient waveforms. The disadvantage is that one must take into account the non-concentricity of the data when regridding for reconstruction. Any error in this interpolation can introduce a misregistration in the k-space trajectory between successive spheroids and could introduce a reflection or "ghost" in the image at the Nyguist frequency.

As yet another alternative, the radius could be a slowly varying function of time so that by the time the trajectory hits the bottom pole of the ellipsoid it is at the radius of the next ellipsoid to be covered. This is a more general case of what was described above for non-concentric spheroids of constant radius. Again, one interpolates between ellipsoids to regrid the data. The trajectories are described by modifying Equations (1a), (1b), and (1c) so that the radius is an appropriate function of time and the Heaviside functions are deleted. The advantage of this method is that the "blips" 78 on the z-gradient in FIG. 2B are replaced by a more smoothly varying distortion of the dominant sinusoidal waveform.

Figure 3A:
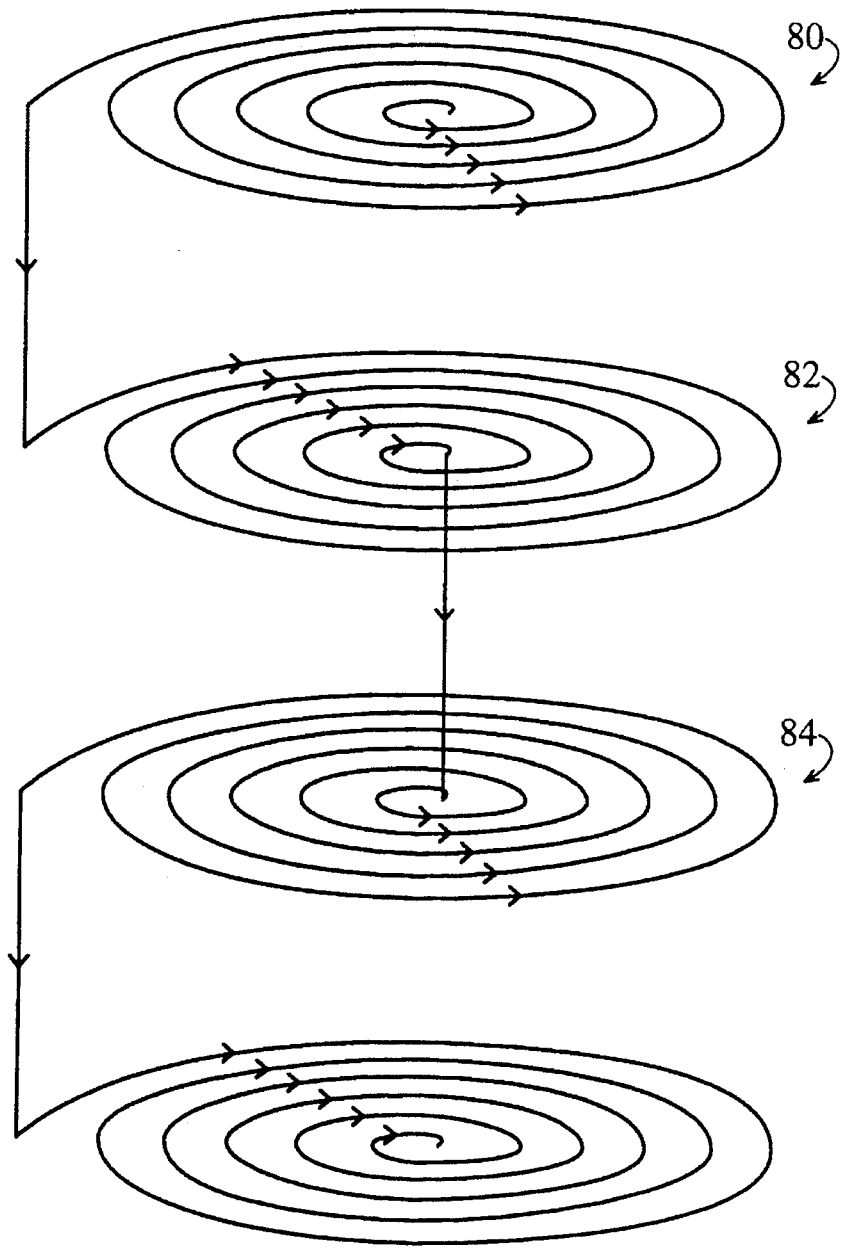
FIG. 3A illustrates a cylindrical spiral k-space trajectory.

With reference to FIG. 3A, k-space can also be covered in a cylindrical spiral fashion with two-dimensional spirals positioned at discrete intervals along the axis of a cylinder. To avoid large discontinuities in the k-space trajectory, the spirals reverse direction on successive planes along the cylinder axis. For example, if the spiral trajectory on a first plane 80 spirals in a counterclockwise direction from the center out, the spiral trajectory on the next plane 82 spirals inward in a clockwise fashion. The spiral trajectory on a third plane 84 again spirals in a clockwise direction from the center out, and so on. Of course, the order in which the spirals are obtained can be reversed.

The k-space trajectory as a function of time is defined by:

$$k_{z,n}(t) = \begin{array}{ll} 0 & ; 0 \leq t \leq nt_1 \quad ; n=1,2,3\ldots, \\ G_z t & ; n > t_1 \leq t \leq nt_2 \\ 0 & ; t \leq nt_2 \end{array} \quad (7a)$$

$$k_{x,n}(t) = \gamma r_x (-1)^n \left[ \frac{t_1}{2} ((-1)^n + 2n - 1) - t \right] \cos[wt(-1)^{(n+1)}], \quad (7b)$$

$$k_{y,n}(t) = \gamma r_y (-1)^n \left[ \frac{t_1}{2} ((-1)^n + 2n - 1) - t \right] \sin[wt(-1)^{(n+1)}]. \quad (7c)$$

In these equations, we loop over the index n, where n is the slice number. Therefore, for each slice n, $t = [0, t_1]$, where $t_1$ is the time it takes to cover the n-th spiral.

The equation for $k_z$ is for an idealized gradient and ignores the finite ramp time for the blipped gradient pulse. However, the ramp time is easily taken into account by inserting an interval during which $k_z$ follows a quadratic trajectory.

Figure 3B:
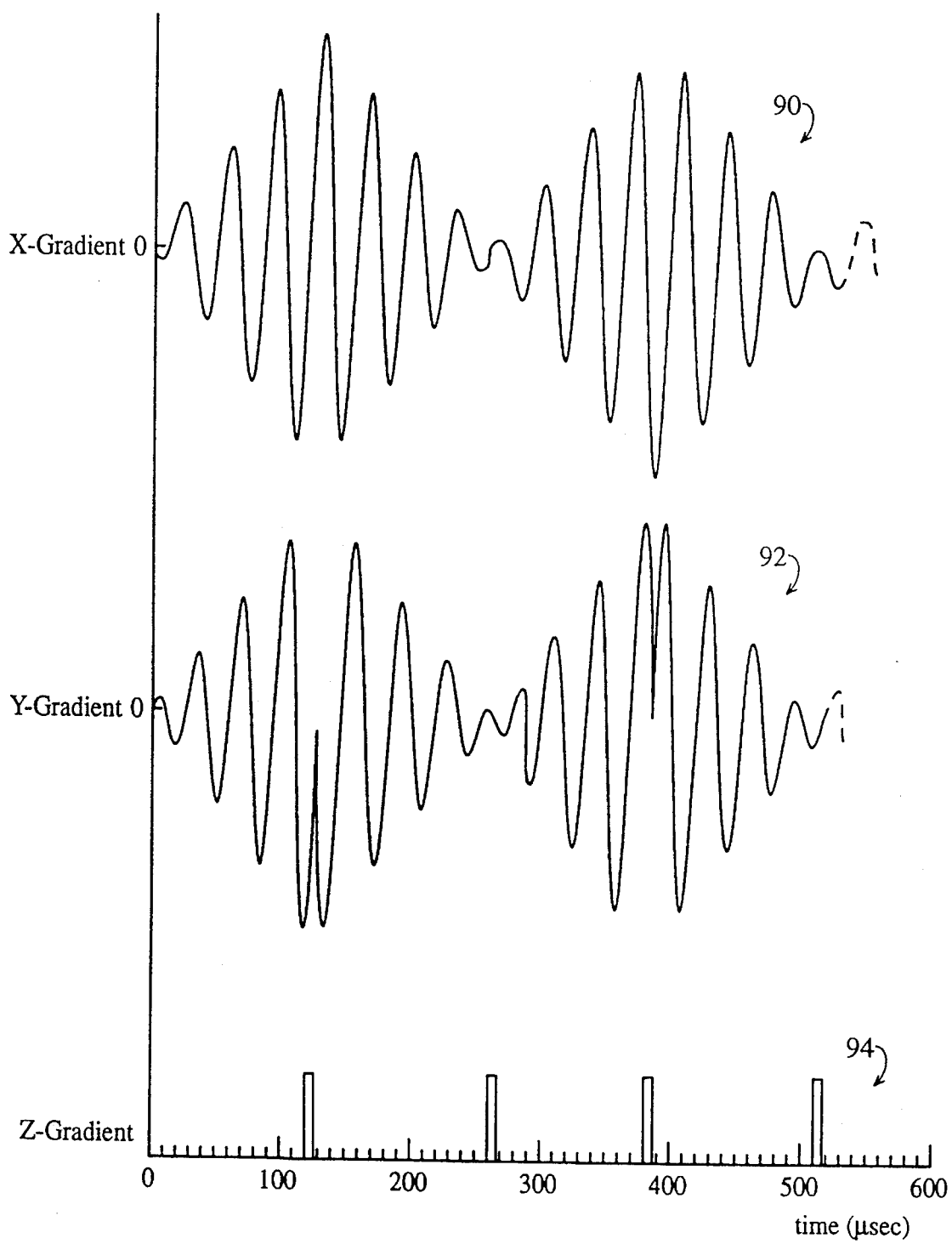
FIG. 3B illustrates a gradient pulse sequence for achieving the spiral trajectory of FIG. 3A.

In the embodiment of FIG. 3B a low resolution acquisition matrix is illustrated for clarity. The x, y, and z-gradients 90, 92, and 94 are defined as follows:

$$G_{x,n}(t) = r_x w \left[ \frac{t_1}{2} ((-1)^n + 2n - 1) - t \right] \sin[wt(-1)^{(n+1)}] - \quad (8a)$$

$$r_x(-1)^n \cos[wt(-1)^{(n+1)}],$$

$$G_{y,n}(t) = r_y w \left[ \frac{t_1}{2} (1 - 2n - (-1)^n) + t \right] \cos[wt(-1)^{(n+1)}] - \quad (8b)$$

$$r_y(-1)^n \sin[wt(-1)^{(n+1)}],$$

$$G_{z,n} = G_z; nt_1 \leq t \leq nt_2. \quad (8c)$$

This produces generally sinusoidal beat patterns. The beats each have the same amplitude as opposed to the linearly increasing beat amplitude of FIG. 2A. Again, FIG. 3B does not include preparatory pulses, including an initial z-gradient pulse to provide the initial offset along the $k_z$ axis.

The discontinuities and phase reversals in the gradient waveforms can be avoided by not switching the direction of the spiral on alternate views. The spirals are preferably acquired from the center out and then from the outside in on alternate views, but the spiral trajectories are all either clockwise or counterclockwise. This is achieved by deleting the $(-1)^{(n+1)}$ term in the sine and cosine expressions for the k-space trajectory. Any misregistration in k-space that this introduces can be corrected by introducing a conventional phase correction algorithm.

Figure 4A:
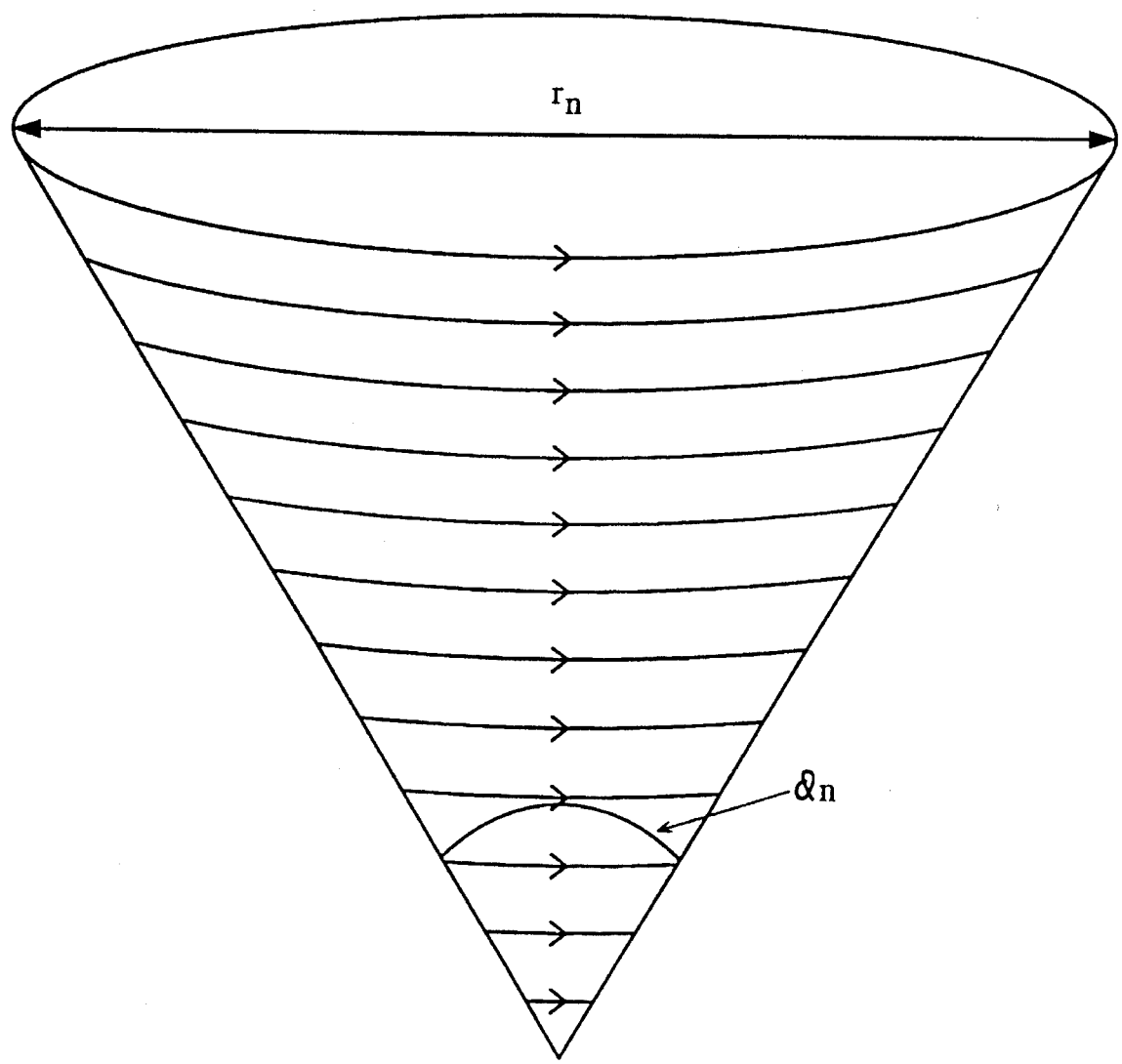
FIG. 4A illustrates a conical spiral k-space trajectory.

With reference to FIG. 4A, another way to cover k-space in three dimensions is conically. In one embodiment, the k-space trajectories spiral over the surface of N cones, where the N cones fit inside one another with a common apex such that they substantially fill a spherical volume. Note that the central "cone" is essentially a flat slice across the center of the spherical volume. The conical angles $\phi_n$, and the outer radii $r_n$ of the cones, vary such that the outer rim of each cone lies on the surface of a sphere. The k-space trajectory alternately spirals into the center of one cone and then back out to the edge of the next cone, thereby adequately sampling the interior of the sphere. In a manner analogous to the spherical spiral case described above, there are two preferred ways to acquire the cones: (1) spiral out over the surface of the cone and then jump to the radius and $k_z$ position of the next cone, or (2) allow the radii of the cones to vary non-linearly with z so that the rims of the consecutive cones walk down along the z-axis along and covering the surface of the sphere.

In the first case, the radii of the cones vary linearly with $k_z$ so we get a stack of cones inside one another whose outer edges conform to a spherical surface. In this case, the trajectory jumps discontinuously from the surface of one cone to the next. Blips in the gradient waveforms are used to make these transitions. Although this embodiment is not described in detail here, the details should be evident to those skilled in the art from the previous discussion.

In the second and preferred case, the radii of the cones vary non-linearly as a function of $k_z$ to make a smooth transition from the surface of one cone to the next. In one embodiment, the radii varies sinusoidally with $k_z$. This avoids making discontinuous transitions in the k-space trajectory and hence eliminates the blips on the gradient waveforms. One possible k-space trajectory that accomplishes this is the following:

$$k_x(t) = \gamma k_0(t) \sin(\alpha t) \cos(w_2 t) \quad (9a),$$

$$k_y(t) = \gamma k_0(t) \sin(\alpha t) \sin(w_2 t) \quad (9b),$$

$$k_z(t) = \gamma k_0(t) \cos(\alpha t) \quad (9c),$$

Figure 4B:
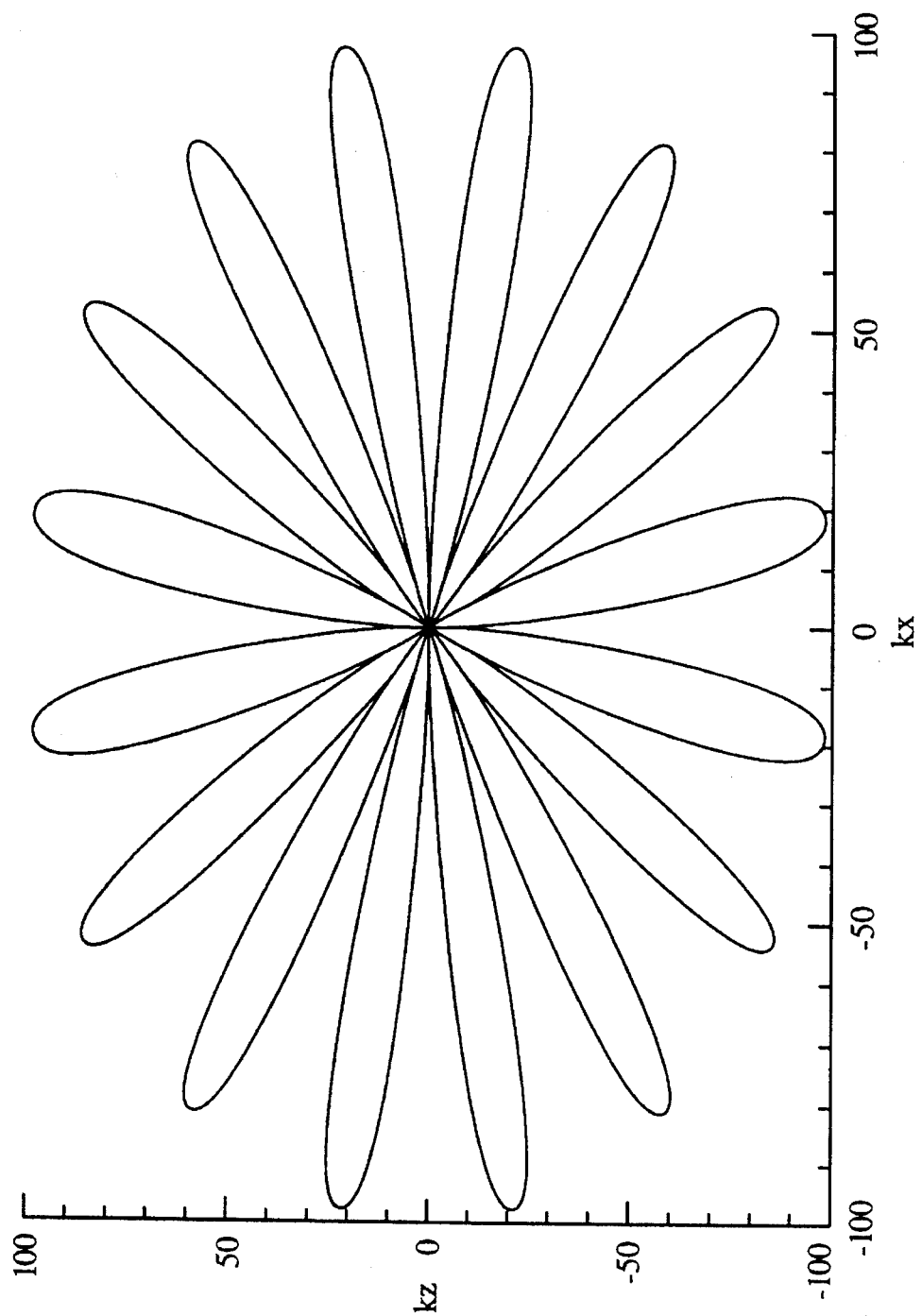
FIG. 4B illustrates a two-dimensional cross-section of the 16 three-dimensional cones.
Figure 4C:
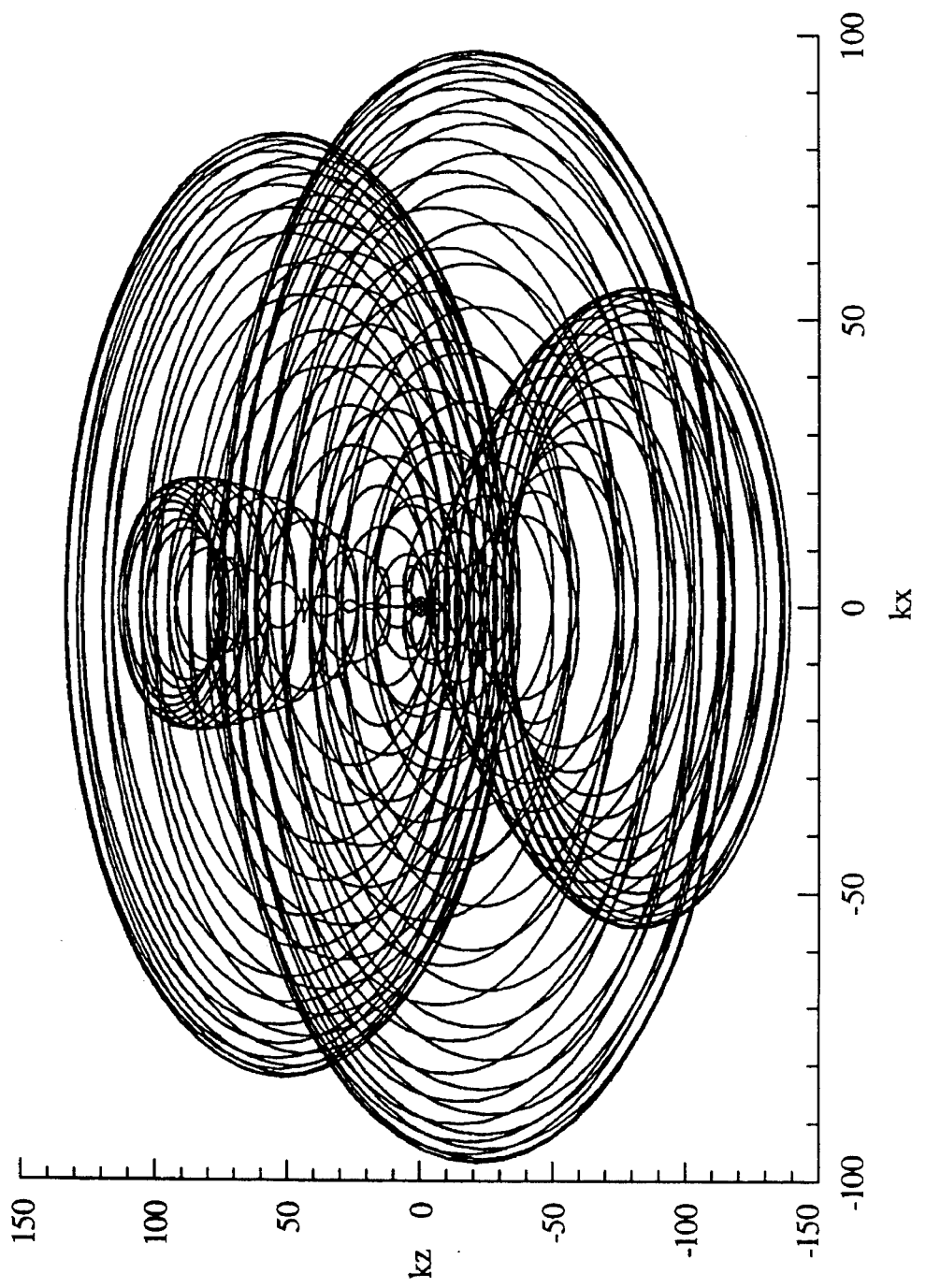
FIG. 4C illustrates a three-dimensional display of a trajectory for 8 cones.

Where:

$k_0(t) = k_0 \sin(w_1 t)$ $\alpha = 2\pi/T$; T=total acquisition time $w_1 = \alpha N_c$, $N_c$=Number of cones $w_2 = w_1 N_s$; $N_s$=Number of spirals per cone Exemplary k-space trajectories are shown in FIGS. 4A, 4B, and 4C. FIG. 4B is a two-dimensional cross-section through the 16 three-dimensional cones. FIG. 4C shows a three-dimensional display of a trajectory for 8 cones.

The gradient waveforms are then:

$$G_x(t) = k_0[w_1 \cos(w_1 t) \sin(\alpha t) \cos(w_2 t) + \alpha \sin(w_1 t) \cos(\alpha t) \cos(w_2 t) - w_2 \sin(w_2 t) \sin(\alpha t) \sin(w_2 t)] \quad (10a),$$

$$G_y(t) = k_0[w_1 \cos(w_1 t) \sin(\alpha t) \sin(w_2 t) + \alpha \sin(w_1 t) \cos(\alpha t) \cos(w_2 t) + w_2 \sin(w_1 t) \sin(\alpha t) \cos(w_2 t)] \quad (10b),$$

$$G_z(t) = k_0[w_1 \cos(w_1 t) \cos(\alpha t) - \alpha \sin(w_2 t) \sin(\alpha t)] \quad (10c).$$

Figure 4D:
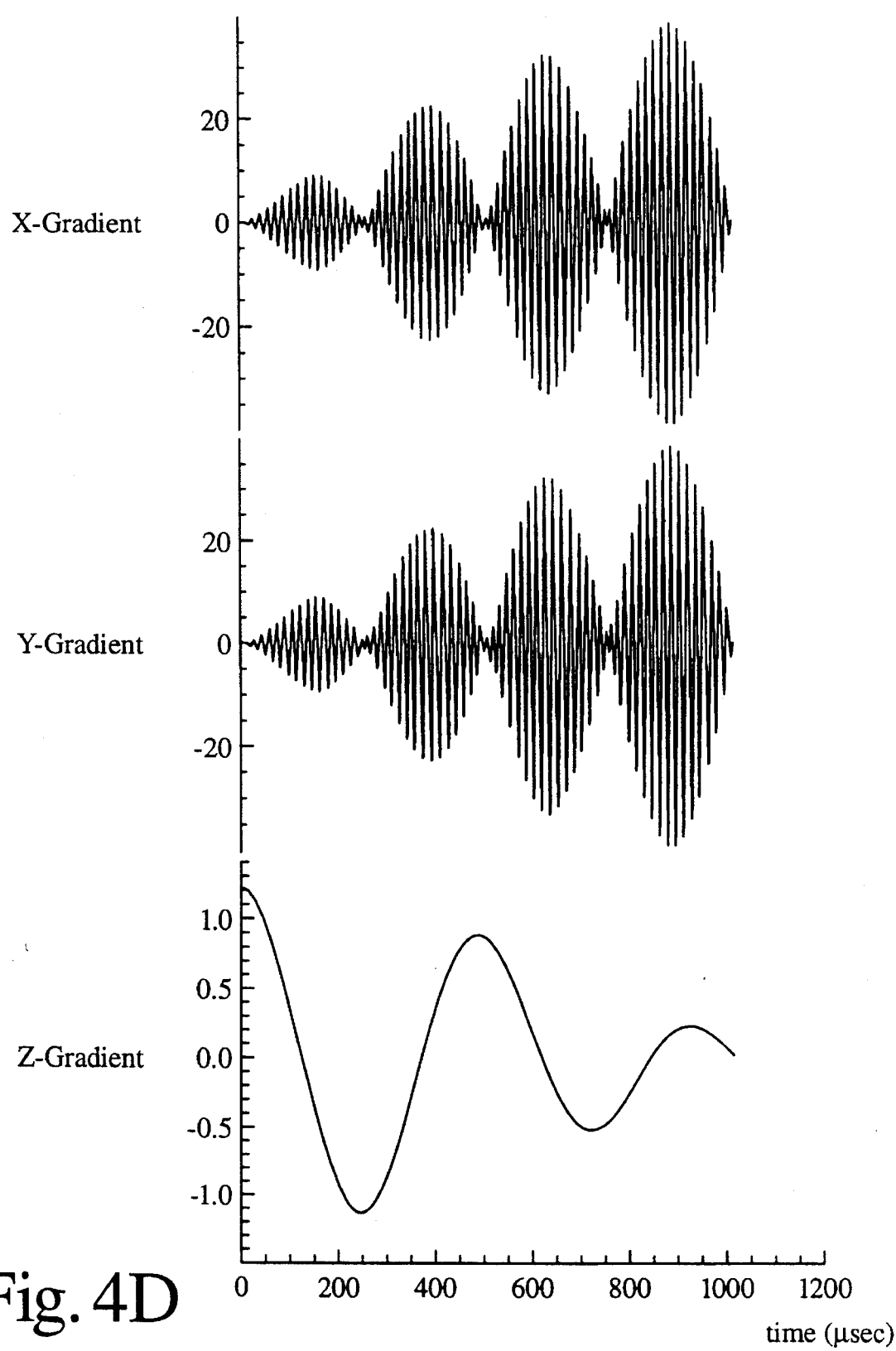
FIG. 4D illustrates a gradient pulse sequence for achieving the conical spiral trajectory of FIG. 4C.
Figure 5A:
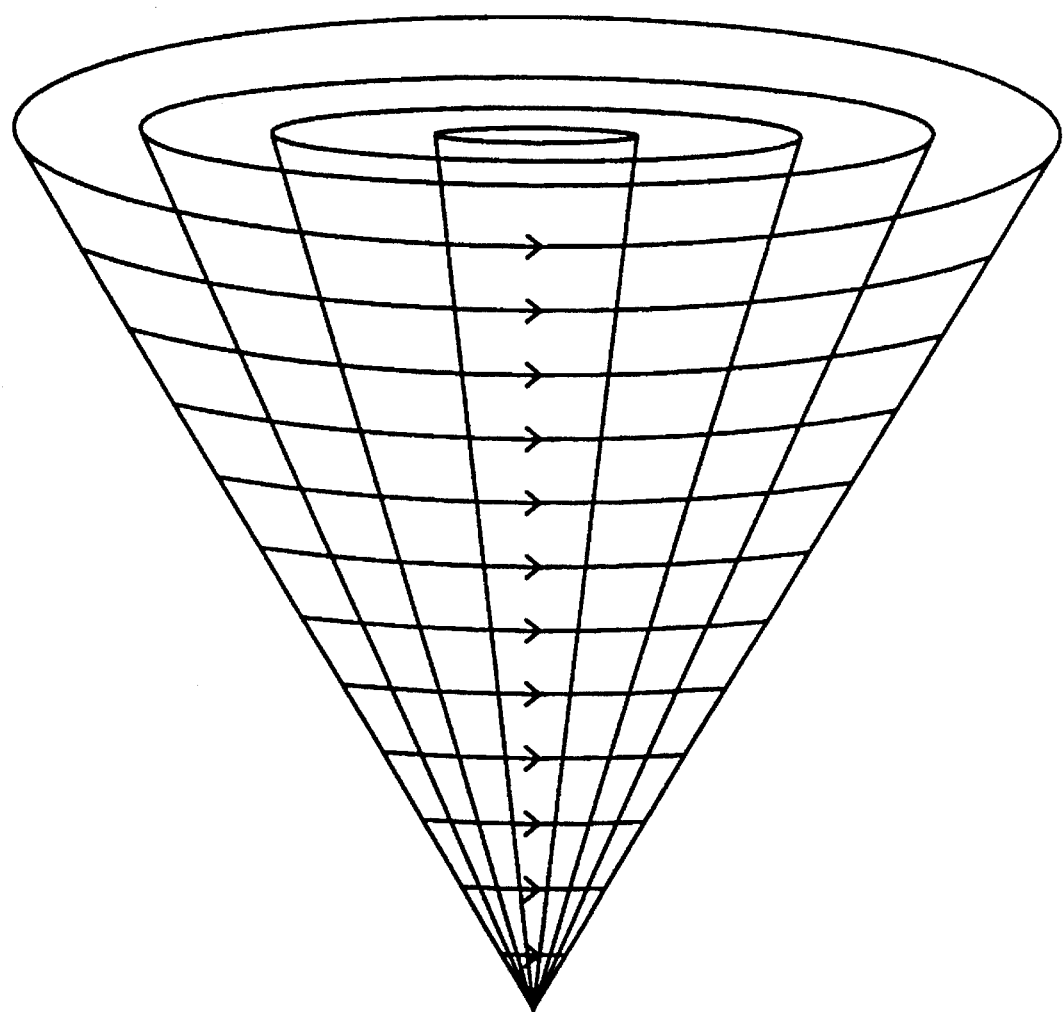
FIG. 5A illustrates an alternate conical embodiment with embedded cones.
Figure 5B:
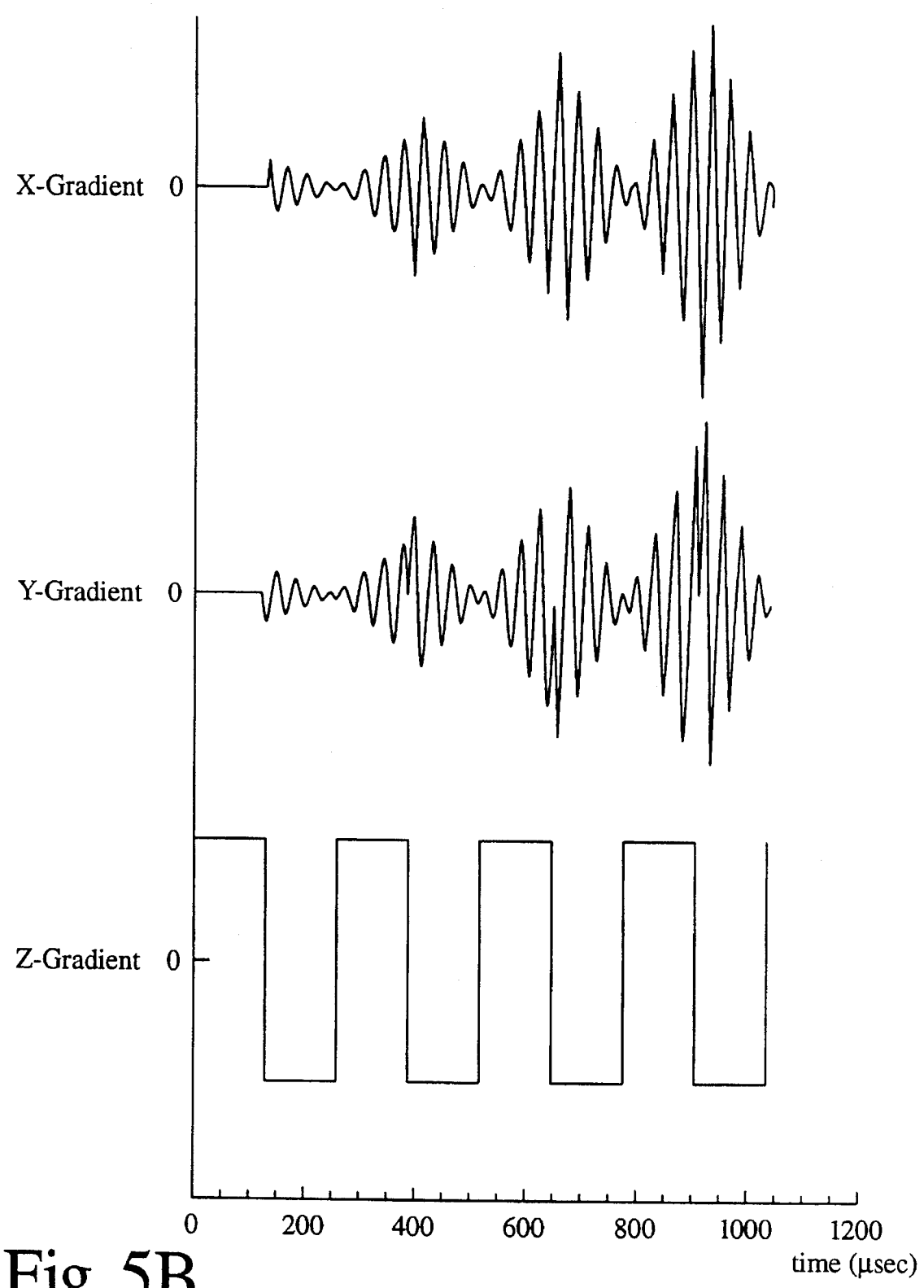
FIG. 5B illustrates a gradient pulse sequence for achieving the conical spiral of FIG. 5A.

These waveforms are shown in FIG. 4D. Alternate embodiments of conical trajectories include embedded cones as shown in FIG. 5A. Multiple sets of embedded cones with different conical angles and radii may be stacked inside one another to cover a cylindrical volume of space. Alternatively, one may acquire interleaved sets of embedded cones from multiple acquisitions to cover a cylindrical volume. The gradient profiles for acquiring a single set of 8 embedded cones is shown in FIG. 5B.

The reconstruction of the resultant data is adapted in accordance with the coverage scheme of k-space. The general image reconstruction technique known as "brute force" reconstruction is defined by:

$$m(\bar{r}) = \Sigma_{\bar{k}} \left[ \frac{\rho(\bar{k})}{D(\bar{k})} \right] e^{(i\bar{k}\cdot\bar{r})}, \tag{11}$$

where $\rho(k)$ is the MR signal intensity at point k in k-space and $D(k)$ is the sampling point density. The field of view is determined by the maximum spacing of nearest neighbors in the non-linear sampled lattice grid. The resolution is determined by the maximum k. The spatial variable r is chosen to be within the imaging volume defined by the overall field of view of the acquisition. To reconstruct a slice at an orientation, a set of r position matrices on the plane defined by the slice are used to evaluate the corresponding image intensity matrix.

Alternately, the reconstruction can take advantage of the speed of the Fast Fourier Transform algorithm (FFT). For the Fast Fourier Transform algorithm, the raw data is conventionally on a three-dimensional uniformly spaced lattice. To generate such a three-dimensional rectilinear data matrix from the spiral data, the spiral data is interpolated or "regridded".

One regridding algorithm for a three-dimensional case regrids a continuous three-dimensional function $m(x,y,z)$ with its continuous Fourier transform $M(u,v,w)$:

$$M(u,v,w) = \int_{-\infty}^{+\infty} m(x,y,z)e^{-i2\pi(ux+vy+wz)}dxdydz. \tag{12}$$

A discretized data sampling function $S(u,v,w)$ consists of N three-dimensional delta functions at points $u_i,v_i,w_i$, where $i=1, 2, \ldots ,N$:

$$S(u,v,w) = \sum_{i}^{N} \delta(u-u_i, v-v_i, w-w_i). \tag{13}$$

The sampled Fourier data is given by:

$$M_{sampled}(u,v,w) = M(u,v,w) \cdot S(u,v,w) \tag{14}$$

In regridding, the sampled data is convolved with a properly selected point spread function $C(u,v,w)$ and then resampled into a unit-spaced three-dimensional lattice:

$$M_{grid}(u,v,w) = [M_{sampled}(u,v,w) * C(u,v,w)] \cdot III(u,v,w) \tag{15},$$

where * denotes a three-dimensional convolution and $$III(u,v,w) = \sum_{ijk} \delta(u-i, v-j, w-k). \tag{18}$$

To correct the non-uniform sampling in k-space, a data sampling density $D(u,v,w)$ is defined as:

$$D(u,v,w) = S(u,v,w) * C(u,v,w) \tag{17}$$

and a new data sampling function is defined as:

$$S_c(u,v,w) = \frac{S(u,v,w)}{D(u,v,w)}. \tag{18}$$

The regridded three-dimensional time domain data on the uniformly spaced lattice is:

$$M_{grid}(u,v,w) = [\{M(u,v,w) \cdot S_c(u,v,w)\} * C(u,v,w)] \cdot III(u,v,w) \tag{19}$$

$$= \left[ \left\{ \frac{M_s(u,v,w)}{D(u,v,w)} \right\} * C(u,v,w) \right] \cdot III(u,v,w)$$

Alternately, for the spherical case, a three-dimensional backprojection of the data can be performed. A Fourier transform is done at every angle through the data and then the data is backprojected onto the plane of the desired slice. The desired plane can be selected at will and the Fourier transform data then projected onto that plane.

For the cylindrical spiral, a Fourier transform is first done through all the spirals along the axis of the cylinder. The data within each spiral is then either regridded and transformed with the two-dimensional Fourier transform as described above, or the spiral data is backprojected with the Fourier transform through the various angles.

The conical data is preferably regridded onto a three-dimensional uniform lattice as described above and subsequently transformed using a three-dimensional Fast Fourier Transform.

Various alternate embodiments are contemplated. As one alternative, the order in which the data is acquired can be varied. For example, the direction of the spirals can be reversed. Reversing the direction of the spirals switches the sinusoidal gradients from linearly increasing with time to linearly decreasing with time or vice versa. Another alternative is to refocus the signal periodically by placing 180° RF pulses at the zero crossings of the gradient waveforms. This reduces the accumulated phase errors introduced by the inhomogeneity of the field in successive views of data. In another embodiment, conjugate symmetry is used to reduce the acquired data by substantially a half. For spiral echo planar imaging, hemispheres of data can be collected instead of full spheres. The other half of the sphere can be generated by conjugate symmetry. For the cylindrical spiral, just over half of the spirals are acquired along the axis of the cylinder and the remainder are generated by using conjugate symmetry. For conical spiral data, just over half the required cones need by acquired.

Another alternate embodiment is to interleave acquisitions so that the three-dimensional k-space matrix is built up in sections from multiple acquisitions.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. In an echo volume magnetic resonance imaging method in which selected dipoles in a volume of interest are induced to resonate by an RF pulse and in which a series of gradients are applied after the RF pulse and in the absence of any additional RF pulses such that resonance signal data is simultaneously detected and spatially encoded along a preselected data collection trajectory in three dimensions in k-space, the improvement comprising:

applying the magnetic field gradients such that the trajectory in k-space follows a three-dimensionally curving spiral trajectory through the three-dimensions.

2. In the echo volume method of magnetic resonance imaging as set forth in claim 1, the improvement further comprising:

configuring the magnetic field gradients such that the trajectory in k-space follows along ellipsoidal surfaces of multiple sizes.

3. In an echo volume imaging method in which selected dipoles in an entire volume of interest are induced to resonate by at least one RF pulse and in which a series of gradients are applied concurrently in the absence of RF pulses such that views of data are collected along a preselected data collection trajectory in three dimensions in k-space, the improvement comprising:

configuring the magnetic field gradients such that the trajectory in k-space follows spiraling paths which lie along a series of spheroidal surfaces of a multiplicity of radii.

4. In the echo volume imaging method as set forth in claim 3, the improvement further comprising:

configuring the magnetic field gradients such that the spheroidal surfaces are concentric spheres.

5. In the echo volume imaging method as set forth in claim 3, the improvement further comprising:

configuring the magnetic field gradients such that the spheroidal surfaces are non-concentric and touch a next larger spheroidal surface at one pole and a next smaller spheroidal surface at an opposite pole.

6. In the echo volume magnetic resonance imaging method as set forth in claim 1, the improvement further comprising:

configuring the magnetic field gradients such that the trajectory through k-space extends along spiral paths lying on surfaces of cones.

7. The echo volume magnetic resonance imaging method as set forth in claim 6, the improvement further comprising:

configuring the magnetic field gradients such that the cones have a common apex and a range of cone angles.

8. A method of echo volume magnetic resonance imaging comprising:

applying a radio frequency pulse to excite magnetic resonance in a volume of interest as a whole;

after exciting magnetic resonance in the whole volume, simultaneously sampling and spatially encoding the excited magnetic resonance in the absence of radio frequency pulses along a curving three-dimensional trajectory through k-space, including concurrently:

applying a first magnetic field gradient along a first axis, the first magnetic field gradient being generally sinusoidal and increasing and decreasing in magnitude in a beat pattern with a first period;

applying a second magnetic field gradient along a second axis, the second magnetic field gradient being generally sinusoidal and increasing and decreasing in magnitude in a beat pattern with the first period;

applying a third magnetic field gradient along a third axis, the third gradient having a second period, one of the first and second periods being an integer multiple of the other;

sampling magnetic resonance data at least during each half cycle of one of the first and second sinusoidal gradients;

reconstructing the sampled data into a volumetric magnetic resonance image representation.

9. The method as set forth in claim 8 wherein the beats of at least one of the first and second gradients decrease linearly in magnitude.

10. The method as set forth in claim 8 wherein the beats of at least one of the first and second gradients increase in magnitude linearly.

11. The method as set forth in claim 10 wherein the third gradient varies generally as a sinusoid having a half wavelength of the first period such that the time for applying one of the beats of the first and second gradients is the same as a half cycle of the third gradient.

12. The method as set forth in claim 11 wherein the third gradient is decreasing in magnitude with each half cycle.

13. The method as set forth in claim 11 wherein the third gradient is increasing in magnitude linearly with each half cycle.

14. The method as set forth in claim 13 wherein the magnitude of the beats of the first and second gradients is changing linearly such that k-space is sampled along a surface of a multiplicity of spheres of different radii.

15. The method as set forth in claim 14 wherein the third magnetic field gradient has a spike at each half cycle such that the trajectory steps between concentric spheres of different radii.

16. The method as set forth in claim 8 wherein the third gradient alternates polarity at the beginning and mid-point of each beat.

17. A method of echo volume imaging comprising:

applying a radio frequency pulse to excite magnetic resonance in a whole volume of interest;

in the absence of additional radio frequency pulses and before the excited resonance decays away, concurrently:

applying a first magnetic field gradient along a first axis, the first magnetic field gradient being generally sinusoidal and rapidly increasing and decreasing in magnitude in a beat pattern with a first periodicity;

applying a second magnetic field gradient along a second axis, the second magnetic field gradient being generally sinusoidal and increasing and decreasing in magnitude in a beat pattern with the first periodicity, the beats of the first and second gradients increasing or decreasing peak amplitudes, such that k-space is traversed along conical spirals;

applying a third magnetic field gradient along a third axis the third gradient having a second periodicity, one of the first and second periodicities being an integer multiple of the other, the third gradient alternating polarity adjacent the beginning and midpoint of each beat;

sampling the magnetic resonance such that the magnetic resonance is sampled along a spirally conical trajectory in k-space;

reconstructing the sampled data into a volumetric image representation.

18. The method as set forth in claim 8 wherein the third gradient includes a series of gradient pulses applied between and at mid-points of each beat of the first and second gradients.

19. The method as set forth in claim 18 wherein the beats of the first and second gradients have substantially constant magnitudes and wherein the sinusoidally varying gradient of one of the first and second gradients changes phase by 180° at a mid-point of each beat, such that k-space is traversed along parallel spiral paths of a cylindrical volume.

\* \* \* \* \*